US009859920B2

(12) United States Patent
Karkkainen et al.

(10) Patent No.: US 9,859,920 B2
(45) Date of Patent: Jan. 2, 2018

(54) ENCODER AND DECODER

(71) Applicant: GURULOGIC MICROSYSTEMS OY, Turku (FI)

(72) Inventors: Tuomas Karkkainen, Turku (FI); Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 0 days.

(21) Appl. No.: 15/321,180

(22) PCT Filed: Jun. 26, 2015

(86) PCT No.: PCT/EP2015/025041
§ 371 (c)(1),
(2) Date: Dec. 21, 2016

(87) PCT Pub. No.: WO2015/197201
PCT Pub. Date: Dec. 30, 2015

(65) Prior Publication Data
US 2017/0155404 A1    Jun. 1, 2017

(30) Foreign Application Priority Data
Jun. 27, 2014   (GB) .................................. 1411451.6

(51) Int. Cl.
*G06F 15/16*     (2006.01)
*H03M 7/30*     (2006.01)
(Continued)

(52) U.S. Cl.
CPC ....... *H03M 7/6047* (2013.01); *H03M 7/6005* (2013.01); *H03M 7/6011* (2013.01);
(Continued)

(58) Field of Classification Search
CPC ..... H04L 65/607; H04L 65/608; H04L 67/02; H04L 69/08
(Continued)

(56) References Cited

U.S. PATENT DOCUMENTS

2010/0306412 A1    12/2010  Therrien et al.
2012/0219065 A1    8/2012   Karkkainen et al.
(Continued)

FOREIGN PATENT DOCUMENTS

EP    2256 934 A1    12/2010
EP    2256934 A1     12/2010
(Continued)

OTHER PUBLICATIONS

"Dictionary coder", Wikipedia, Mar. 8, 2014, pp. 1-3.
(Continued)

*Primary Examiner* — Kristie Shingles
(74) *Attorney, Agent, or Firm* — Eric L. Sophir; Dentons US LLP

(57) ABSTRACT

An encoder for encoding input data to generate corresponding encoded data is provided. The encoder identifies substantial reoccurrences of data blocks and/or data packets within at least a portion of the input data. The encoder then identifies, in respect of individual elements, where elements are unchanged and/or changed within the substantially reoccurring data blocks and/or data packets. Subsequently, the encoder encodes unchanged elements in the encoded data by employing at least one corresponding symbol, or at least one corresponding bit, for example a single bit, indicating an absence of change in the unchanged elements relative to corresponding elements in a reference data block and/or data packet. Moreover, the encoder encodes changed elements in the encoded data.

35 Claims, 8 Drawing Sheets

(51) Int. Cl.
    *H04L 29/06* (2006.01)
    *H04L 29/08* (2006.01)
(52) U.S. Cl.
    CPC .......... *H04L 65/607* (2013.01); *H04L 65/608* (2013.01); *H04L 67/02* (2013.01); *H04L 69/08* (2013.01)
(58) Field of Classification Search
    USPC ........................................................ 709/246
    See application file for complete search history.

(56) References Cited

U.S. PATENT DOCUMENTS

| | | |
|---|---|---|
| 2012/0233135 A1 | 9/2012 | Tofano |
| 2013/0290474 A1 | 10/2013 | Therrien et al. |
| 2013/0315307 A1 | 11/2013 | Karkkainen et al. |
| 2014/0337299 A1 | 11/2014 | Therrien et al. |

FOREIGN PATENT DOCUMENTS

| | | | |
|---|---|---|---|
| GB | 2 362 055 | A | 11/2001 |
| GB | 2 511 355 | A | 9/2014 |
| GB | 2 511 493 | A | 9/2014 |
| GB | 2 507 603 | B | 10/2014 |
| RU | 2417518 | C2 | 4/2011 |
| RU | 2428722 | C2 | 9/2011 |
| WO | 2014/131517 | A1 | 9/2014 |
| WO | 2014/131526 | A1 | 9/2014 |
| WO | 2014/131527 | A1 | 9/2014 |

OTHER PUBLICATIONS

Data deduplication—Wikipedia, the free encyclopedia (accessed Sep. 27, 2013). URL: http://en.wikipedia.org/wiki/Data_deduplication, pp. 1-3.
Delta encoding—Wikipedia, the free encyclopedia. URL: http://en.wikipedia.org/wiki/Delta_encoding, pp. 1-5.
Written Opinion of the International Searching Authority issued in International Application No. PCT/EP2015/025041 with dated Oct. 12, 2015.
International Search Report issued in International Application No. PCT/EP2015/025041 with dated Oct. 12, 2015.
Combined Search and Examination Report under Sections 17 and 18(3) for Application No. GB1411451.6 dated Dec. 22, 2014.
Korean Office Action (and English Translation) with a dated of May 19, 2017 in Korean Patent Application No. 10-2016-7036600, 7 pages.
Russian Office Action and Search Report (with English Translation) dated Aug. 8, 2017 in corresponding Russian Application No. 2017100660/09(001169), 10 pages.

ENCODER AND DECODER

This application is a National Stage of PCT/EP2015/025041, filed Jun. 26, 2015, which claims priority under 35 U.S.C. §119 to GB Application No. 1411451.6, filed Jun. 27, 2014, all of which are incorporated herein by reference in their entirety.

TECHNICAL FIELD

The present disclosure relates generally to data compression, and more specifically, to encoders for encoding input data (D1) to generate corresponding encoded data (E2), and decoders for decoding the encoded data (E2) to generate corresponding decoded data (D3). Moreover, the present disclosure relates to methods of encoding input data (D1) to generate corresponding encoded data (E2), and methods of decoding the encoded data (E2) to generate corresponding decoded data (D3). Furthermore, the present disclosure also relates to computer program products comprising non-transitory (namely non-transient) computer-readable storage media having computer-readable instructions stored thereon, the computer-readable instructions being executable by a computerized device comprising processing hardware to execute the aforesaid methods. The present disclosure also relates to codecs, including at least one aforementioned encoder and at least aforementioned decoder.

BACKGROUND

It has become a customary contemporary practice to compress data to reduce usage of resources, for example, during data storage and data communication. During data communication, a sequence of data blocks or data packets is communicated from one device to another device. Data blocks or data packets communicated later in the sequence are often changed in comparison to data blocks or data packets that have been communicated earlier. However, changes in individual elements inside these changed data blocks or data packets are considerably smaller than the original content of the data blocks or data packets. In other words, most of the elements inside the changed blocks are unchanged in comparison to the earlier data blocks or data packets. When such a sequence of data blocks or data packets is compressed using conventional encoders, often only a small compression ratio is achieved.

One conventional encoder-decoder (hereinafter referred to as "coded") has been described in US patent document 20120219065 A1, titled "Processing of Image". The conventional codec processes entire data blocks of an image or data sequence, and compares the entire data blocks with previous data blocks. The conventional codec encodes an unchanged data block to a predefined colour value or data value, and also encodes a changed data block as it is. This means that all the original data values in a changed data block are coded, and so a compression efficiency performance provided by the conventional encoder-decoder is not as great as potentially achievable.

In a patent document US2013/0315307A1 (Karkkainen et al.), there is described an encoder that employs changed/unchanged bits to express whether a corresponding data block, for example inside an image frame, has changed or not. Although such an approach functions well, it is feasible to enhance its performance significantly.

Moreover, another conventional codec (http://en.wikipedia.org/wiki/Delta encoding) employs delta coding for processing data. In delta coding, a difference (namely, a delta value) between a current data element and a previous data element is written or transmitted. However, such delta values often generate new data values that are potentially not present in the data or otherwise enlarges the dynamic of the data values, and therefore, an increase entropy of the data thereby potentially arises.

Therefore, there exists a need for such a codec for compressing data that is more efficient in comparison to the conventional codecs.

SUMMARY

The present disclosure seeks to provide an improved encoder for encoding input data (D1) to generate corresponding encoded data (E2).

The present disclosure also seeks to provide an improved decoder for decoding encoded data (E2) to generate corresponding decoded data (D3).

Moreover, the present disclosure seeks to provide an improved method of encoding input data (D1) to generate corresponding encoded data (E2).

Moreover, the present disclosure also seeks to provide an improved method of decoding encoded data (E2) to generate corresponding decoded data (D3).

In a first aspect, embodiments of the present disclosure provide an encoder including processing hardware for encoding input data (D1) to generate corresponding encoded data (E2), wherein the processing hardware is operable to process the input data (D1) as data blocks and/or data packets, characterized in that the processing hardware is operable to:
  (i) identify substantial reoccurrences of data blocks and/or data packets within at least a portion of the input data (D1), wherein the data blocks and/or data packets include a corresponding plurality of elements, wherein the elements include a plurality of bits;
  (ii) identify where elements are unchanged within the substantially reoccurring data blocks and/or data packets, and/or where elements are changed within the substantially reoccurring data blocks and/or data packets;
  (iii) encode unchanged elements in the encoded data (E2) by employing at least one corresponding symbol or at least one corresponding bit indicating an absence of change in the unchanged elements relative to corresponding elements in a reference data block and/or data packet and
  (iv) encode changed elements in the encoded data (E2).

Optionally, the input data (D1) is in a form of at least one of: text data, image data, video data, audio data, binary data, sensor data, measurement data, graphical data, multi-dimensional data and/or one-dimensional data, but not limited thereto.

The present invention is of advantage in that encoding performance is enhanced considerably by identifying and encoding partial changes within data blocks and/or data packets.

It will be appreciated that an element may optionally be one of the following: a byte, a word, an integer, a character, a pixel value, an audio sample amplitude in mono or stereo, but not limited thereto. In other words, the element is usually a single value, but sometimes it can be for example a pixel, namely a type of picture data element which may also contain a few data values meaning mutually different things, similarly to stereo in case of audio data. Moreover, an element pursuant to the present disclosure is either a value or it contains a few values, and when change is detected, it is required anyway that those values can be processed either together or separately. In practice, a pixel value, for example its R (red), G (green) and B (blue) values, can either have changed or unchanged, but it is also possible that only the R value of the pixel has changed or unchanged. However, the element cannot contain two corresponding values from a same source, such as two R (red) values, namely Rs1 and Rs2 (wherein "s" has a meaning of a different spatial location) for an image, or At1 and At2 ("t" meaning different timing) in audio. Thus, the element must be defined spatially and temporally, but it may not be bound to a source, for example a sensor for color R (red), a sensor for color B (blue), or first microphone for audio value Am1 and second microphone for audio value Am2, or first and second camera. In other words, the point in time is the same for various different things, and the spatial location is the same for those various different things, but their source may change; one does not receive input from many different locations at a same point in time, and to one and the same location at many different points in time.

It will be appreciated that, in addition to pixels, the element can also be, for example, a voxel, namely a pixel in three dimensions, and they can of course be measured with two cameras. Moreover, a texel is similar to a pixel, but it refers to a texture element, or a texture pixel; it is a fundamental unit of texture space, used in computer graphics in drawing images in 2D or 3D onto a display using a Graphics Processor Unit (GPU). Moreover, the element can be, for example, a resel, a concept used in image analysis. It describes the actual spatial image resolution in an image, or a volume. Furthermore, many signals such as audio signals may have several channels of data, and so forth. Other examples of elements can include, for example, base pairs of DNA or RNA in genomic data.

Optionally, a reference data block and/or a reference data packet is a previous data block or data packet; a data block or a packet in a similar location in a previous frame, a view or a channel; a data block or a data packet described by a motion vector (namely motion compensation); a data block or a data packet described by symbol (namely deduplication); a data block or a data packet encoded with some coding method (for example using coding methods such as DC encoding, multilevel encoding, slide encoding, line encoding, discrete cosine transform (DCT) encoding, database encoding, vector quantization encoding, palette encoding, interpolation encoding, extrapolation encoding). Optionally, the at least one corresponding symbol is represented by a predetermined data value. Optionally, the predetermined data value is implemented as a zero data value. Optionally, the unchanged value, for example when the value of the bit is 0, and the changed value, for example when the value of the bit is 1, are described by bits in a separate data stream, and only the changed input data values are encoded into the data stream.

Optionally, the processing hardware is operable to implement chunked transfer encoding for Hypertext Transfer Protocol (HTTP) and/or Real-Time Messaging Protocol (RTMP). More optionally, the HTTP and/or RTMP employ fixed-size data blocks and/or data packets inside requests and responses.

Optionally, the processing hardware is operable to encode at least a portion of the changed elements in a quantized manner in the encoded data (E2). Such a quantized manner of operation is capable of providing an enhanced degree of data compression.

When all the elements in a given data block or data packet are unchanged as compared to a reference data block or data packet, then, optionally, the data block or packet is set as unchanged and then there is no need to deliver any other information for that data block or data packet. Optionally, the data blocks and data packets with all values changed are also separated from partially changed data blocks or data packets.

The method described in this disclosure is beneficially used for encoding the partially changed data blocks or packets, by way of encoding where changes have occurred to one or more elements within the partially changed data blocks or packets. Partially changed data blocks or packets contain both changed and unchanged data values. Optionally, the method is also operable to encode changed data blocks or packets. Optionally, the method is also operable to encode unchanged data blocks or packets.

Moreover, optionally, the processing hardware is operable to apply a compression algorithm to compress the encoded data (E2), for example Range coding, SRLE (split run length encoding)(for example as described in a patent GB2507603B1 and also in a patent application PCT/EP2014/000530), Delta coding, ODelta coding (for example as described in a patent GB2511355B, and also in a patent application PCT/EP2014/00510), EM (entropy modifying encoding)(for example as described in a patent application GB2511493A, and also in a patent application PCT/EP2014/000529), Arithmetic coding, Huffman coding, but not limited thereto, to compress the encoded data (E2) to generate compressed data (C4) which is included into the encoded output data (E2). Such additional compression provided by the compression algorithm is capable of further compressing the encoded data (E2) relative to the input data (D1).

In a second aspect, embodiments of the present disclosure provide a decoder including processing hardware for decoding encoded data (E2) to generate corresponding decoded data (D3),. wherein the processing hardware is operable to process the encoded data (E2) as data blocks and/or data packets, characterized in that the processing hardware is operable to:

(i) decode the encoded data (E2) to generate data for changed elements, the changed elements being elements that are changed within substantial reoccurrences of data blocks and/or data packets within the encoded data (E2);

(ii) decode the encoded data (E2) to generate data for unchanged elements, the unchanged elements being elements that are unchanged within the substantial reoccurrences of data blocks and/or data packets within the encoded data (E2), wherein the unchanged elements are represented by at least one corresponding symbol or at least one corresponding bit indicating an absence of change in the unchanged elements relative to corresponding elements in a reference data block and/or data packet and (iii) assemble the data generated for the changed and unchanged elements in (i) and (ii) into data blocks and/or data packets to generate the decoded data (D3), wherein the data blocks and/or data packets include a corresponding plurality of elements, wherein the elements include a plurality of bits.

Optionally, the at least one corresponding symbol is represented by a predetermined data value. More optionally, the predetermined data value is implemented as a zero data value.

Optionally, the processing hardware is operable to implement chunked transfer encoding for Hypertext Transfer Protocol (HTTP) and/or Real-Time Messaging Protocol (RTMP). More optionally, the HTTP and/or RTMP employ fixed-size data blocks and/or data packets inside requests and responses.

Optionally, the processing hardware is operable to decode at least a portion of the changed elements in a quantized manner in the decoded data (D3).

Optionally, the processing hardware is operable to apply a decompression algorithm to decompress compressed data (C4) to generate the encoded data (E2) for decoding the encoded data (E2) to generate the data for the changed and unchanged elements.

Optionally, the decoded data (D3) is in a form of at least one of: text data, image data, video data, audio data, binary data, sensor data, measurement data, graphical data, multi-dimensional data and/or one-dimensional data, but not limited thereto.

In a third aspect, embodiments of the present disclosure provide a codec including the aforementioned encoder and the aforementioned decoder. Optionally, the codec is in a form of at least one of: a video codec, an audio codec, an image codec and/or a data codec, but not limited thereto.

In a fourth aspect, embodiments of the present disclosure provide a method of encoding input data (D1) to generate corresponding encoded data (E2), wherein the method includes processing the input data (D1) as data blocks and/or data packets, characterized in that the method includes:
  (i) identifying substantial reoccurrences of data blocks and/or data packets within at least a portion of the input data (D1), wherein the data blocks and/or data packets include a corresponding plurality of elements, wherein the elements include a plurality of bits;
  (ii) identifying where elements are unchanged within the substantially reoccurring data blocks and/or data packets, and/or where elements are changed within the substantially reoccurring data blocks and/or data packets;
  (iii) encoding unchanged elements in the encoded data (E2) by employing at least one corresponding symbol or at least one corresponding bit indicating an absence of change in the unchanged elements relative to corresponding elements in a reference data block and/or data packet and
  (iv) encoding changed elements in the encoded data (E2).

Optionally, the method includes encoding the input data (D1) received in a form of at least one of: text data, image data, video data, audio data, binary data, sensor data, measurement data, graphical data, multi-dimensional data, uni-dimensional data.

Optionally, the method includes representing the at least one corresponding symbol by a predetermined data value. More optionally, the predetermined data value is implemented as a zero data value.

Optionally, the method includes implementing chunked transfer encoding for Hypertext Transfer Protocol (HTTP) and/or Real-Time Messaging Protocol (RTMP). More optionally, the HTTP and/or RTMP employ fixed-size data blocks and/or data packets inside requests and responses.

Optionally, the method includes encoding at least a portion of the changed elements in a quantized manner in the encoded data (E2).

Optionally, the method includes applying a compression algorithm to compress the encoded data (E2) to generate corresponding compressed data (C4).

In a fifth aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method.

In a sixth aspect, embodiments of the present disclosure provide a method of decoding encoded data (E2) to generate corresponding decoded data (D3), wherein the method includes processing the encoded data (E2) as data blocks and/or data packets, characterized in that the method includes:
  (i) decoding the encoded data (E2) to generate data for changed elements, the changed elements being elements that are changed within substantial reoccurrences of data blocks and/or data packets within the encoded data (E2),
  (ii) decoding the encoded data (E2) to generate data for unchanged elements, the unchanged elements being elements that are unchanged within the substantial reoccurrences of data blocks and/or data packets within the encoded data (E2), wherein the unchanged elements are represented by at least one corresponding symbol or at least one corresponding bit indicating an absence of change in the unchanged elements relative to corresponding elements in a reference data block and/or data packet and
  (iii) assembling the data generated for the changed and unchanged elements in steps (i) and (ii) into data blocks and/or data packets to generate the decoded data (D3), wherein the data blocks and/or data packets include a corresponding plurality of elements, wherein the elements include a plurality of bits.

Optionally, the method includes generating the decoded data (D3) in a form of at least one of: text data, image data, video data, audio data, binary data, sensor data, measurement data, graphical data, multi-dimensional data, uni-dimensional data.

Optionally, the at least one corresponding symbol is represented by a predetermined data value. More optionally, the predetermined data value is implemented as a zero data value.

Optionally, the method includes implementing chunked transfer encoding for Hypertext Transfer Protocol (HTTP) and/or Real-Time Messaging Protocol (RTMP). More optionally, the HTTP and/or RTMP employ fixed-size data blocks and/or data packets inside requests and responses.

Optionally, the method includes decoding at least a portion of the changed elements in a quantized manner in the decoded data (D3).

Optionally, the method includes applying a decompression algorithm to decompress compressed data (C4) to generate the encoded data (E2) for decoding the encoded data (E2) to generate the data for the changed and unchanged elements.

In a seventh aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method.

Embodiments of the present disclosure substantially eliminate, or at least partially address, the aforementioned problems in the prior art, and enable lossless or near-lossless data compression of one-dimensional image data or multi-dimensional image data, video data, audio data and any other type of data with a high compression ratio.

Additional aspects, advantages, features and objects of the present disclosure are made apparent in the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
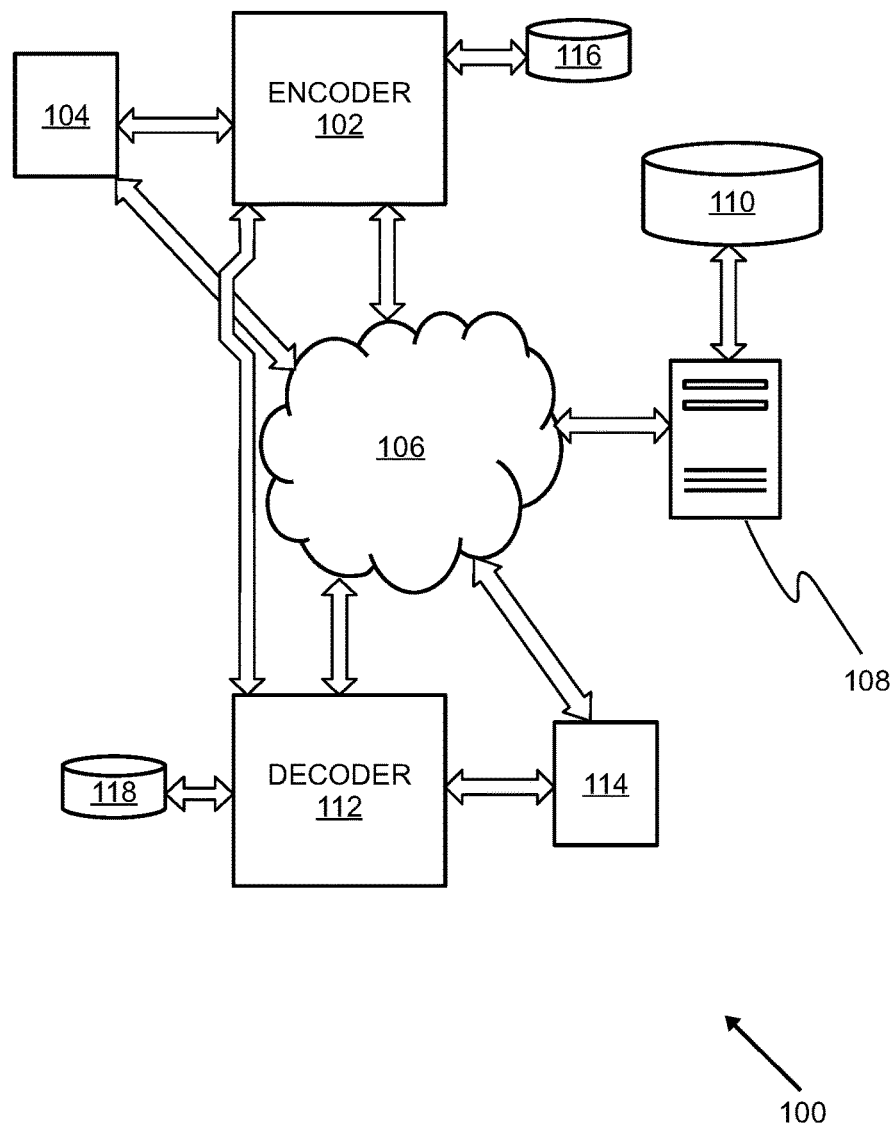
FIG. 1 is a schematic illustration of an example network environment that is suitable for practicing embodiments of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although the best mode of carrying out the present disclosure has been disclosed, those skilled in the art would recognize that other embodiments for carrying out or practicing the present disclosure are also possible.

Embodiments of the present disclosure provide an encoder including processing hardware for encoding input data (D1) to generate corresponding encoded data (E2). The processing hardware is operable to process the input data (D1) as data blocks and/or data packets. Optionally, the input data (D1) is in a form of at least one of: text data, image data, video data, audio data, binary data, sensor data, measurement data, graphical data, genomic data, multi-dimensional data and/or one-dimensional data, but not limited thereto.

The processing hardware is operable to identify substantial reoccurrences of data blocks and/or data packets within the input data (D1). The processing hardware is then operable to identify where elements are unchanged within the substantially reoccurring data blocks and/or data packets, and/or where elements are changed within the substantially reoccurring data blocks and/or data packets.

Subsequently, the processing hardware is operable to encode unchanged elements in the encoded data (E2) by employing at least one corresponding symbol, or at least one corresponding bit, for example a single bit, indicating an absence of change in the unchanged elements relative to corresponding elements in a reference data block and/or data packet. Optionally, the at least one corresponding symbol is represented by a predetermined data value. Optionally, the predetermined data value is implemented as a zero data value. Optionally, the unchanged value, for example when the bit value is 0, and the changed value, for example when the bit value is 1, are described by bits in a separate bit stream and only the changed input data values are encoded to the data stream. By "channel" is meant at least one of: a channel-defined portion of the encoded data (E2), a channel-defined separate stream of data, a channel-defined separate data file.

Moreover, the processing hardware is operable to encode changed elements in the encoded data (E2). Optionally, the processing hardware is operable to encode at least a portion of the changed elements in a quantized manner in the encoded data (E2).

Moreover, optionally, the processing hardware is operable to apply a compression algorithm, for example Range coding, SRLE, Delta coding, ODelta coding, EM (entropy modifying) coding, Arithmetic coding, Huffman coding, but not limited thereto, to compress the encoded data (E2) to generate compressed data (C4) which is included into the encoded output data (E2).

Furthermore, embodiments of the present disclosure also provide a decoder including processing hardware for decoding encoded data (E2) to generate corresponding decoded data (D3). The processing hardware is operable to process the encoded data (E2) as data blocks and/or data packets.

The processing hardware is operable to decode the encoded data (E2) to generate data for elements that are changed (hereinafter referred to as "changed elements") within substantial reoccurrences of data blocks and/or data packets within the encoded data (E2). Optionally, the processing hardware is operable to decode at least a portion of the changed elements in a quantized manner in the decoded data (D3). By "quantized manner" is meant that the changed elements are decoded into data, wherein the decoded data is selected from a finite number of possible values for the data, namely the decoded data changes in a non-continuous manner.

The processing hardware is operable to decode the encoded data (E2) to generate data for elements that are unchanged (hereinafter referred to as "unchanged elements") within the substantial reoccurrences of data blocks and/or data packets within the encoded data (E2). In the encoded data (E2), the unchanged elements are represented by at least one corresponding symbol, or at least one corresponding bit, for example a single bit, indicating an absence of change in the unchanged elements relative to corresponding elements in a reference data block and/or data packet.

Optionally, the processing hardware is operable to apply a decompression algorithm to decompress compressed data (C4) present in the encoded data (E2) for use in decoding the encoded data (E2) to generate the data for the changed and unchanged elements.

Moreover, the processing hardware is operable to assemble the data generated for the changed and unchanged elements into data blocks and/or data packets to generate the decoded data (D3).

Optionally, the decoded data (D3) is in a form of at least one of: text data, image data, video data, audio data, binary data, sensor data, measurement data, graphical data, genomic data, multi-dimensional data and/or one-dimensional data, but not limited thereto.

Furthermore, embodiments of the present disclosure also provide a codec including the aforementioned encoder and the aforementioned decoder. Optionally, the codec is in a form of at least one of: a video codec, an audio codec, an image codec and/or a data codec, but not limited thereto.

Moreover, optionally, the encoder and the decoder are operable to implement chunked transfer encoding for Hypertext Transfer Protocol (HTTP) and/or Real-Time Messaging Protocol (RTMP). Optionally, the HTTP and/or RTMP employ fixed-size data blocks and/or data packets inside requests and responses to the requests.

Referring now to the drawings, particularly by their reference numbers, FIG. 1 is a schematic illustration of an example network environment 100 that is suitable for practicing embodiments of the present disclosure. The network environment 100 includes an encoder 102 and one or more electronic devices, depicted as an electronic device 104 in FIG. 1. The network environment 100 also includes a communication network 106, and one or more data servers and/or data storages and one or more databases, depicted as a data server and/or data storage 108 and a database 110 in FIG. 1. Additionally, the network environment 100 includes a decoder 112 and one or more computerized devices, depicted as a computerized device 114 in FIG. 1. Optionally, the network environment 100 includes one or more databases and/or one or more local data memories (116, 118) which are spatially local to devices of the network environment 100.

The network environment 100 is optionally implemented in various ways, depending on various possible scenarios. In one example scenario, the network environment 100 is optionally implemented by way of a spatially collocated arrangement of the data server and/or data storage 108 and the database 110 coupled mutually in communication via a direct connection, for example, as shown in FIG. 1. In another example scenario, the network environment 100 is optionally implemented by way of a spatially distributed arrangement of the data server and/or data storage 108 and the database 110 coupled mutually in communication via a communication network, such as the communication network 106. In yet another example scenario, the data server and/or data storage 108 and the database 110 are optionally implemented via cloud computing services. Optionally, the network environment 100 is implemented in a distributed peer-to-peer (P2P) manner.

The data server and/or data storage 108 is coupled in communication with the encoder 102 and the decoder 112, via the communication network 106 or via a direct connection. Moreover, the encoder 102 is coupled in communication with the decoder 112, via the communication network 106 or via a direct connection.

The communication network 106 is optionally a collection of individual networks, interconnected with each other and functioning as a single large network. Such individual networks are optionally wired, wireless, or a combination thereof. Examples of such individual networks include, but are not limited to, Local Area Networks (LANs), Wide Area Networks (WANs), Metropolitan Area Networks (MANs), Wireless LANs (WLANs), Wireless WANs (WWANs), Wireless MANs (WMANs), the Internet, second generation (2G) telecommunication networks, third generation (3G) telecommunication networks, fourth generation (4G) telecommunication networks, and Worldwide Interoperability for Microwave Access (WiMAX) networks.

The electronic device 104 provides the encoder 102, either directly or through the communication network 106, which has input data (D1) as an input thereto. Optionally, the input data (D1) is in a form of at least one of: text data, image data, video data, audio data, binary data, sensor data, measurement data, graphical data, genomic data, multi-dimensional data and/or one-dimensional data, but not limited thereto. The input data (D1) is optionally modified data, a part of an entire data sequence, or a combination of various types of data. Optionally, the input data (D1) is received as a stream or as a file.

The encoder 102 includes processing hardware that is operable to execute computer-readable instructions stored on a non-transitory (namely non-transient) computer-readable storage medium for encoding the input data (D1) to generate corresponding encoded data (E2). Alternatively, or additionally, the processing hardware is hardwired, for example implemented by way of an application-specific integrated circuit (ASIC), a state-variable machine or similar.

Optionally, the encoder 102 is implemented as a part of the electronic device 104. In this case, the processing hardware of the encoder 102 is included in the electronic device 104. In an example, the electronic device 104 is an image and/or video capturing device that generates in operation large quantities of image and/or video data, wherein a lossless compression is desired so as to preserve fine information in the image and/or video data, whilst rendering the quantities of the image and/or video data manageable for data storage purposes. Examples of such image and/or video capturing devices include, but are not limited to, surveillance cameras, video recorders, X-ray devices, Magnetic Resonance Imaging (MRI) scanners, and ultrasound scanners. The electric device 104 is beneficially implemented using Reduced Instruction Set Computing (RISC) processors that are capable of performing data manipulations associated with methods of the present disclosure in a highly efficient manner, while simultaneously being very energy efficient.

Alternatively, optionally, the encoder 102 is implemented independently, for example, using a computerized device that includes the processing hardware of the encoder 102.

Upon receiving the input data (D1), the processing hardware of the encoder 102 is operable to process the input data (D1) as data blocks and/or data packets. Optionally, these data blocks and/or data packets have a fixed size. Alternatively, the data blocks and/or data packets have a variable size; optionally, the variable size is determined as a function of content and/or format of the input data (D1). Optionally, the content is automatically analyzed by employing a combination of spatial Fourier analysis and temporal Fourier analysis for computing one or more parameters for determining the variable size of the data blocks and/or data packets. Fourier transforms, for example Fast Fourier Transform (FFT), are known to a person skilled in the art, and are optionally implemented in a recursive manner, for example using one or more RISC processors.

The processing hardware of the encoder 102 is operable to identify substantial reoccurrences of data blocks and/or data packets within the input data (D1), namely, substantially similar data blocks and/or data packets within the input data (D1). The processing hardware of the encoder 102 is then operable to identify where elements are unchanged within the substantially reoccurring data blocks and/or data packets, and/or where elements are changed within the substantially reoccurring data blocks and/or data packets.

Subsequently, the processing hardware of the encoder 102 is operable to encode, in the encoded data (E2), unchanged elements within each data block and/or data packet by employing at least one corresponding symbol or one or more corresponding bits, for example a single bit, indicating an absence of change in the unchanged elements within that data block and/or data packet relative to corresponding elements within its corresponding reference data block and/or data packet. In this regard, a "MemoryCompare" functionality is optionally used to compare elements of a given data block and/or data packet with elements of a reference data block and/or data packet.

Optionally, the reference data block and/or data packet is fixed. In an example, the reference data block and/or data packet is similar for all of the data blocks and/or data packets of the input data (D1). In another example, the reference data block and/or data packet is similar for at least a subset of the data blocks and/or data packets of the input data (D1).

Alternatively, optionally, the reference data block and/or data packet changes, based on certain criteria, as will be elucidated below. In an example, when a number of changed elements within a given data block and/or data packet and another block and/or data packet is less than a predefined threshold number, then the given data block and/or data packet can be taken as a reference data block and/or data packet for any data block and/or data packet in the input data (D1). In another example, a previous data block and/or data packet is taken as a reference data block and/or data packet for a current data block and/or data packet in the input data (D1). Optionally, the previous data block and/or data packet is a data block and/or data packet after which the current data block consecutively followed. Alternatively, optionally, the previous data block and/or data packet is a data block and/or data packet that occurred in a previous frame, view or channel. Yet alternatively, optionally, the previous data block and/or data packet is a data block and/or data packet that was known or selected beforehand. Yet alternatively, optionally, the information of the selected previous data block and/or data packet is delivered with a symbol or reference number describing it or with, for example, a motion vector describing the selected data block and/or data packet.

Optionally, the at least one corresponding symbol is represented by a predetermined data value. Optionally, the predetermined data value is determined based on an analysis of data values of changed elements of the data blocks and/or data packets of the input data (D1); such analysis is performed, for example by performing a statistical analysis of element values within data blocks present in the input data (D1); such analysis provides "identification" pursuant to the present disclosure. Optionally, the predetermined data value is implemented as a zero data value. Alternatively, optionally, bits are used to describe changed and unchanged data values in a data block or packet and are sent to another stream, and in such a case, only the changed data values are optionally encoded to the data stream.

Moreover, the processing hardware of the encoder 102 is operable to encode the changed elements in the encoded data (E2). Optionally, for a lossless operation, the processing hardware of the encoder 102 is operable to encode the changed elements in their original form in the encoded data (E2). Alternatively, optionally, for a lossy operation, the processing hardware of the encoder 102 is operable to encode at least a portion of the changed elements in a quantized manner in the encoded data (E2).

Yet alternatively, optionally, for a near-lossless operation, the processing hardware of the encoder 102 is operable to encode at least some portion of the changed elements in a quantized manner in the encoded data (E2). For this purpose, the processing hardware of the encoder 102 is optionally operable to quantize only some portions of the changed elements, based on an analysis of content, type and/or composition of the input data (D1); such an analysis is operable, for example to determine an occurrence of regions of interest in the input data (D1) which are beneficially encoded with better or worse quality than other regions of interest. Optionally, if the input data is medical, military, binary, text or similar data, then it beneficially must be coded losslessly, but if the input data is audio, video, still images and so forth, then lossy coding is beneficially allowed as well. Of course, there potentially occur regions of interest in the input data (D1) which are beneficially encoded with better or worse quality than other regions of interest. Consequently, the encoder 102 is capable of adaptively varying a compression ratio of lossily encoded data by changing the quantization between the input data (D1) and the encoded data (E2).

Moreover, optionally, the processing hardware of the encoder 102 is operable to apply a compression algorithm to compress the encoded data (E2) to generate compressed data (C4). In this regard, the encoder 102 is beneficially useable with any contemporary entropy encoders; for example encoders utilizing Range coding, SRLE, Delta coding, ODelta coding, EM, Arithmetic coding, Huffman coding.

Furthermore, the encoder 102 is operable to communicate the encoded data (E2) to the data server and/or data storage 108 for storing in the database 110. The data server and/or data storage 108 is arranged to be accessible to the decoder 112, either via the communication network or via a direct connection, which is beneficially compatible with the encoder 102, for subsequently decoding the encoded data (E2). In an example where the compression algorithm is applied to compress the encoded data (E2) to generate the compressed data (C4), the encoder 102 communicates the compressed data (C4) in the encoded data (E2) to the data server and/or data storage 108 either via a communication network or via a direct connection for storing in the database 110.

In some examples, the decoder 112 is optionally operable to access the encoded data (E2) or the compressed data (C4) from the data server and/or data storage 108. In alternative examples, the encoder 102 is optionally operable to stream the encoded data (E2) or the compressed data (C4) to the decoder 112, either via the communication network 106 or via a direct connection. Optionally, in addition, a data file can be produced as output of the encoder 102 and used as input for the decoder 112. Moreover, it will be appreciated that a device equipped with a hardware or software encoder can also communicate directly with another device equipped with a hardware or software decoder. In yet other alternative examples, the decoder 112 is optionally implemented so as to retrieve the encoded data (E2) or the compressed data (C4) from a non-transitory (namely non-transient) computer-readable storage medium, such as a hard drive and a Solid-State Drive (SSD).

The decoder 112 includes processing hardware that is operable to execute computer-readable instructions stored on a non-transitory (namely non-transient) computer-readable storage medium for decoding the encoded data (E2) to generate corresponding decoded data (D3).

Optionally, the decoder 112 is implemented as a part of the computerized device 114. In this case, the processing hardware of the decoder 112 is included in the computerized device 114. Examples of the computerized device 114 include, but are not limited to, a mobile phone, a smart telephone, a Mobile Internet Device (MID), a tablet computer, an Ultra-Mobile Personal Computer (UMPC), a phablet computer, a Personal Digital Assistant (PDA), a web pad, a Personal Computer (PC), a handheld PC, a laptop computer, a desktop computer, a large-sized touch screen with an embedded PC, and an interactive entertainment device, such as a game console, a video player, a Television (TV) set and a Set-Top Box (STB).

Alternatively, optionally, the decoder 112 is implemented independently, for example, using another computerized device that includes the processing hardware of the decoder 112.

When required, the processing hardware of the decoder 112 is operable to decode the encoded data (E2) to generate the corresponding decoded data (D3). In this regard, the processing hardware of the decoder 112 is operable to process the encoded data (E2) as data blocks and/or data packets.

The processing hardware of the decoder 112 is operable to decode the encoded data (E2) to generate data for the changed elements within the substantially reoccurring data blocks and/or data packets within the encoded data (E2). Optionally, for a lossless operation, the processing hardware of the decoder 112 is operable to decode the changed elements to their original form in the decoded data (D3). Alternatively, optionally, for a lossy operation, the processing hardware of the decoder 112 is operable to decode at least a portion of the changed elements in a quantized manner in the decoded data (D3); optionally, the quantized manner of decoding employs a quantization which is variable, for example depending upon a format or type of data present in the encoded data (E2), wherein such variable quantization is capable on reducing power consumption in decoders, which is important for low-power portable devices, for example battery-powered devices. Yet alternatively, optionally, for a near-lossless operation, the processing hardware of the decoder 112 is operable to decode at least some portion of the changed elements in a quantized manner in the decoded data (D3).

Moreover, the processing hardware of the decoder 112 is operable to decode the encoded data (E2) to generate data for the unchanged elements within the substantially reoccurring data blocks and/or data packets within the encoded data (E2). In the encoded data (E2), the unchanged elements are represented by the at least one corresponding symbol, or at least one corresponding bit, for example a single bit, indicating the absence of change in the unchanged elements relative to corresponding elements in a reference data block and/or data packet, as described earlier. Accordingly, optionally, the processing hardware of the decoder 112 is operable to identify where the at least one corresponding symbol, or at least one corresponding bit, for example a single bit, has occurred within a given data block and/or data packet of the encoded data (E2), and to replace the at least one corresponding symbol, or alternatively, to set at least one data value to the position of the corresponding bit in the data block and/or data packet with corresponding elements in the reference data block and/or data packet.

In an example where the decoder 112 is provided with the compressed data (C4), the processing hardware of the decoder 112 is operable to apply a decompression algorithm to decompress the compressed data (C4) to generate the encoded data (E2) for decoding the encoded data (E2) to generate the data for the changed and unchanged elements.

Moreover, the processing hardware of the decoder 112 is operable to assemble the data generated for the changed and unchanged elements into data blocks and/or data packets to generate the decoded data (D3). Optionally, the decoded data (D3) so generated is in a form of at least one of: text data, image data, video data, audio data, binary data, sensor data, measurement data, graphical data, genomic data, multi-dimensional data and/or one-dimensional data, but not limited thereto.

Subsequently, optionally, the decoder 112 is operable to send the decoded data (D3) to the computerized device 114.

Furthermore, optionally, the encoder 102 and the decoder 112 are arranged to be implemented in a codec. Optionally, the codec is in a form of at least one of: a video codec, an audio codec, an image codec and/or a data codec, but not limited thereto. The codec optionally is used in portable electronic devices such as digital cameras, mobile telephones, smart phones, surveillance equipment and such like.

Moreover, optionally, the encoder 102 and the decoder 112 are operable to implement chunked transfer encoding for Hypertext Transfer Protocol (HTTP) and/or Real-Time Messaging Protocol (RTMP). Optionally, the HTTP and/or RTMP employ fixed-size data blocks and/or data packets inside requests and responses to the requests. Typically, the RTMP resets a size of the data block and/or data packets during a communication session periodically, based on a response time and capacity of a communication network.

FIG. 1 is merely an example, which should not unduly limit the scope of the claims herein. It is to be understood that the specific designation for the network environment 100 is provided as an example and is not to be construed as limiting the network environment 100 to specific numbers, types, or arrangements of encoders, electronic devices, decoders, computerized devices, data servers and/or data storages, databases, and communication networks. A person skilled in the art will recognize many variations, alternatives, and modifications of embodiments of the present disclosure.

Figure 2:
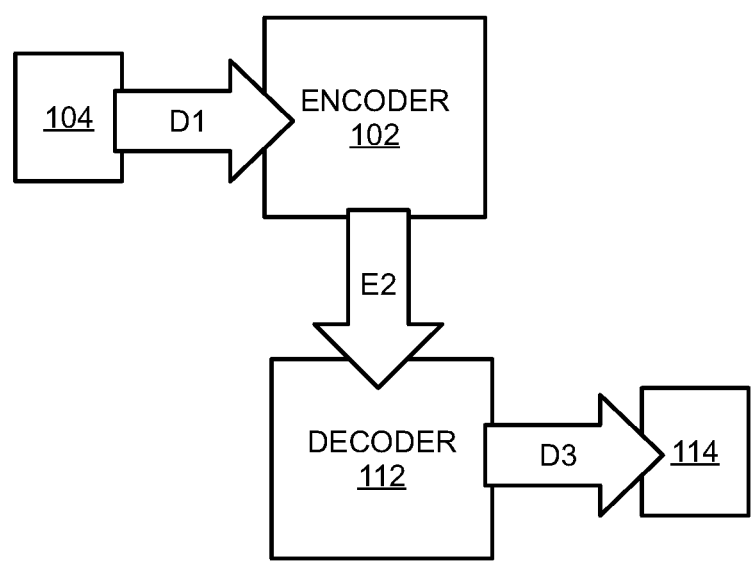
FIG. 2 is an illustration of an example data flow, in accordance with an embodiment of the present disclosure.

FIG. 2 is an illustration of an example data flow, in accordance with an embodiment of the present disclosure. For illustration purposes, an example will be described wherein the electronic device 104 is an Internet Protocol (IP) camera that has been employed at a facility for implementing a remote surveillance system, for example, for detecting intruders and/or for detecting hazardous events, such as fire, flooding, and the like.

The IP camera is operable to provide the encoder 102 with sensor data as sensed by one or more image sensors included within the IP camera. In this example, the sensor data includes one-dimensional image data or multi-dimensional image data and/or video data and/or other types of data.

Moreover, in operation, a video captured by the electronic device 104 is streamed to the computerized device 114 so as to be viewed by a user associated therewith.

In the example data flow, the input data (D1) is an original video captured by an IP camera. The input data (D1) is typically large in size; and therefore, requires a large data storage space for storing it in the database 110 and a large network bandwidth for transferring it via the communication network 106 or via a direct connection.

In order to encode the input data (D1) to the encoded data (E2), the processing hardware of the encoder 102 is operable to analyze content, type and/or composition of the input data (D1). Based on the analysis, the processing hardware of the encoder 102 is operable to divide image frames, views, or channels of the video into a plurality of data blocks. The analysis beneficially involves, for example, computing a spectrum of changes occurring in the input data (D1), for example a spectrum of temporal rates of change in the input data (D1), and also an analysis of spatial portions of temporal sequences of images and their associated rates of change in the input data (D1). Beneficially, the analysis is operable to find periodicities in the data, namely recurring configurations of data, and where such periodicity is found, then it is advantageous to conduct the division of the data to blocks or packets based on such periodicity.

Optionally, each image frame, view or channel is divided into the data blocks in a similar manner. This is particularly beneficial for enabling selection of reference data blocks in previous image frames, views or channels.

This method is optionally used with a deduplication method or a block encoder (for example as described in a patent GB2503295B), and a corresponding block decoder (for example as described in a patent application GB1214400.2), that are operable to detect reoccurrences, namely selecting a suitable reference block, and to store and update the reference data blocks and/or data packets. These methods further are operable to split the data into suitable data blocks and/or data packets, and to combine the data blocks and/or data packets back to generate the decoded data (D3). Optionally, a block encoder is used to generate data streams that are then encoded with a deduplication method, for example as described in the foregoing.

Optionally, the data blocks are rectilinear in relation to areas of data frames represented by these data blocks, for example, 64×64 elements, 32×16 elements, 4×20 elements, 10×4 elements, 1×4 elements, 3×1 elements, 8×8 elements, 1×1 element and so on. However, it will be appreciated here that other shapes of data blocks can alternatively be employed, for example, such as triangular, hexagonal, elliptical and circular. In one example, the input data (D1) corresponds to an image of billowing smoke or flames, or a turbulent water flow that includes multiple curved image components that are inefficiently represented by rectilinear data blocks, but map efficiently onto elliptical and circular data blocks, thereby providing potentially a higher degree of data compression. Moreover, the term 'data block' optionally refers to a data block as well as data segments included within the data block, throughout the present disclosure.

Optionally, the data blocks have a predefined size. The predefined size is optionally either user-defined or system-defined by default. Optionally, the predefined size is defined by the encoder 102 based on the analysis of the content, type and/or composition of the input data (D1), as described in the foregoing. Optionally, the data blocks have a fixed size. Therefore, the size of the data blocks is either known to the decoder 112 or transmitted only once to the decoder 112. When the data blocks have a fixed size, header information describing the size of the data blocks is not required to be written or transmitted, thereby enabling greater data compression to be achieved.

Moreover, optionally, the processing hardware of the encoder 102 is operable to define reference data blocks of a reference frame corresponding to data blocks of a first image frame, or data block or data packet, of the video. For this purpose, the processing hardware of the encoder 102 is operable to reset data values of elements of the reference data blocks or data packets to a predetermined data value. Optionally, the predetermined data value is implemented as a zero data value.

Alternatively, optionally, the processing hardware of the encoder 102 is operable to write or transmit the first image frame, or data block or data packet, as it is, and to define the data blocks of the first image frame as the reference data blocks for a next image frame. In an example, for a given data block in a current image frame, a reference data block is selected to be a data block that is at a position in a previous image frame that is similar to a position of the given data block in the current image frame. In this example, data values of the previous image frame are required to be stored in memory, instead of data values of the reference data block.

For a given data block, the processing hardware of the encoder 102 is operable to process through data values of all elements of the given data block, and to compare the data values of the elements of the given data block with data values of corresponding elements of its corresponding reference data block.

Optionally, for a lossless operation, the data values are read without quantization. If a data value of a particular element of the given data block is different from a data value of a corresponding element of the reference data block, that particular element is considered a changed element. Otherwise, if the data value of the particular element of the given data block is identical, or optionally substantially identical, to the data value of the corresponding element of the reference data block, that particular element is considered an unchanged element.

Alternatively, optionally, for a lossy operation, the data values are quantized before the comparison is made. If a difference between a quantized data value of a particular element of the given data block and a quantized data value of a corresponding element of the reference data block is greater than a predefined threshold value, that particular element is considered a changed element. Otherwise, if the difference between the quantized data values is smaller or equal to the predefined threshold value, that particular element is considered an unchanged element. Optionally, the predefined threshold value is based on a quality level set for the lossy operation. The better the quality that is required, the smaller threshold value that is used. The predefined threshold is zero for lossless operation.

Subsequently, the processing hardware of the encoder 102 is operable to encode, in the encoded data (E2), unchanged elements of the given data block using at least one corresponding symbol, or at least one corresponding bit, for example a single bit, as described earlier. Additionally, the processing hardware of the encoder 102 is operable to encode the changed elements in the encoded data (E2), as described earlier.

Additionally, optionally, the processing hardware of the encoder 102 is operable to write data values of the changed elements to the current or new reference data block. Thus, the reference data block is optionally also used for a next data block, or next data blocks.

In this manner, the processing hardware of the encoder 102 is operable to encode the data blocks of the input data (D1) in the encoded data (E2). The encoder 102 then communicates the encoded data (E2) to the decoder 112, as shown in FIG. 2.

Next, in order to decode the encoded data (E2) to generate the corresponding decoded data (D3), the processing hardware of the decoder 112 is operable to identify occurrences of the at least one corresponding symbol or one corresponding bit within a given data block within the encoded data (E2), and to replace the at least one corresponding symbol or set the data value in the position of the corresponding bit in a data block and/or data packet with corresponding elements in the reference data block.

Subsequently, the processing hardware of the decoder 112 is operable to assemble data generated for the changed and unchanged elements, to generate the decoded data (D3).

Subsequently, the decoder 112 sends the decoded data (D3) to the computerized device 114. Continuing from the aforementioned example of the data flow where the input data (D1) is the original video, the user is presented the video on a display screen of the computerized device 114.

Moreover, the encoder 102 optionally streams the encoded data (E2) to the decoder 112, whilst concurrently encoding the input data (D1) in real time. This is particularly beneficial in a situation where source data is encoded at a multimedia server in real time for streaming to users, for example, for Internet-delivered multimedia services.

FIG. 2 is merely an example, which should not unduly limit the scope of the claims herein. A person skilled in the art will recognize many variations, alternatives, and modifications of embodiments of the present disclosure.

In another example, the encoder 102 and/or the decoder 112 are implemented in a similar manner to encode audio data, wherein the audio data may be divided into a plurality of data packets and/or data sections. The term 'data packet and/or data section' is synonymous with the term 'data block and/or data packet', but pertains to audio data rather than image and/or video data. Optionally, the processing hardware of the encoder 102 is operable to concurrently encode audio data along with image and/or video data. When audio signals include tones which are sustained over many cycles of audio signal and/or the music is rhythmic in nature with substantially repetitive rhythmical patterns, such audio signals are efficiently compressed using encoding methods of the present disclosure. Most contemporary popular music tends to be repetitively rhythmic in nature.

However, it will be appreciated that the encoder 102 can be used to encode other types of data in a similar manner, for example, including at least one of: economic data, measurement data, seismographic data, analog-to-digital converted data, biomedical signal data, textural data, calendar data, mathematical data, genomic data and binary data, but not limited thereto.

The encoder 102 and the decoder 112 are suitable for various types of data, because a majority of data being processed or encoded has been produced in a machine language by machines, and therefore, is divisible to data blocks and/or data packets.

Moreover, principal traffic in communication networks includes transmitting requests and responses to requests. This means data bytes are sent back and forth. These data bytes mostly contain partially or entirely similar IP packet data. Therefore, the encoder 102 and the decoder 112 are well-suited for communication protocols used in transferring data packets.

For illustration purposes only, there will next be considered an example wherein the input data (D1) includes five Transmission Control Protocol/Internet Protocol (TCP/IP) frames, represented as following:

```
00 0c 29 9d b4 1d 00 10 f3 2a 2a ac 08 00 45 00
00 28 78 fa 40 00 76 06 ce 63 3e f1 c1 34 ac 10
11 3c 22 c9 c0 dc bd 1f b7 03 1f fe c0 92 50 10
00 fe b9 09 00 00
00 0c 29 9d b4 1d 00 10 f3 2a 2a ac 08 00 45 00
00 28 79 0d 40 00 76 06 ce 50 3e f1 c1 34 ac 10
11 3c 22 c9 c0 dc bd 1f b7 03 1f fe c9 cc 50 10
01 02 af cc 00 00
00 0c 29 9d b4 1d 00 10 f3 2a 2a ac 08 00 45 00
00 28 79 11 40 00 76 06 ce 4c 3e f1 c1 34 ac 10
11 3c 22 c9 c0 dc bd 1f b7 03 1f fe d1 41 50 10
01 02 a8 57 00 00
00 0c 29 9d b4 1d 00 10 f3 2a 2a ac 08 00 45 00
00 28 79 19 40 00 76 06 ce 44 3e f1 c1 34 ac 10
11 3c 22 c9 c0 dc bd 1f b7 03 1f fe dd a4 50 10
01 02 9b f4 00 00
00 0c 29 9d b4 1d 00 10 f3 2a 2a ac 08 00 45 00
00 28 79 43 40 00 76 06 ce 1a 3e f1 c1 34 ac 10
11 3c 22 c9 c0 dc bd 1f b7 03 1f fe e9 95 50 10
01 02 90 03 00 00
```

In the example, the five TCP/IP frames have been randomly selected from numbers #185 to #198. These TCP/IP frames require a total of 270 bytes (=2160 bits) for communicating over a communication network.

In operation, the processing hardware of the encoder 102 processes the TCP/IP frames as individual data blocks, and encodes them in the encoded data (E2), represented as following:

```
00 0c 29 9d b4 1d 00 10 f3 2a 2a ac 08 00 45 00
00 28 78 fa 40 00 76 06 ce 63 3e f1 c1 34 ac 10
11 3c 22 c9 c0 dc bd 1f b7 03 1f fe c0 92 50 10
00 fe b9 09 00 00
00 00 00 00 00 00 00 00 00 00 00 00 00 00 00 00
00 00 79 0d 00 00 00 00 00 50 00 00 00 00 00 00
00 00 00 00 00 00 00 00 00 00 00 00 c9 cc 00 00
01 02 af cc 00 00
00 00 00 00 00 00 00 00 00 00 00 00 00 00 00 00
00 00 00 11 00 00 00 00 00 4c 00 00 00 00 00 00
00 00 00 00 00 00 00 00 00 00 00 00 d1 41 00 00
00 00 a8 57 00 00
00 00 00 00 00 00 00 00 00 00 00 00 00 00 00 00
00 00 00 19 00 00 00 00 00 44 00 00 00 00 00 00
00 00 00 00 00 00 00 00 00 00 00 00 dd a4 00 00
00 00 9b f4 00 00
00 00 00 00 00 00 00 00 00 00 00 00 00 00 00 00
00 00 00 43 00 00 00 00 00 1a 00 00 00 00 00 00
00 00 00 00 00 00 00 00 00 00 00 00 e9 95 00 00
00 00 90 03 00 00
```

In this example, the data value '00' represents at least one corresponding symbol indicating an absence of change in unchanged elements relative to corresponding elements in a reference data block. Although the data value '00' is also present in the input data (D1), it does not cause any problems in this example, because no changed data value is represented by '00'. Often, there is a need to use a symbol for unchanged data elements that is not present in the input data (D1). Optionally, unchanged/changed decision bits can be delivered with the changed data values instead of delivering the predefined symbols for unchanged data and the changed data values.

It is evident that the encoded data (E2) has low entropy, in comparison to the input data (D1). When the encoded data (E2) is entropy-coded with an advanced range coding method that is based on arithmetic compression, compressed data (C4) so generated requires only 113 bytes (=904 bits) for communicating over the communication network. Correspondingly, when the input data (D1) is entropy-coded in a similar manner, compressed input data so generated requires 253 bytes (=2024 bits). Thus, an amount of data to be communicated over the communication network is reduced by 140 bytes (253–113), namely, by 55.3%. The original amount of input data (D1) without any compression is 270 bytes.

In another example, there are processed two first frames of the previous example by using quantization and bits describing the unchanged/changed decision. Quantization is applied by using the divider value '2', and dequantization by using the multiplier value '2'. The threshold for changed values is '1', and the changed values are expressed with the bit value '1', and the unchanged values with the bit value '0'. The original data frames are as follows:

| 00 | 0c | 29 | 9d | b4 | 1d | 00 | 10 | f3 | 2a | 2a | ac | 08 | 00 | 45 | 00 |
| 00 | 28 | 78 | fa | 40 | 00 | 76 | 06 | ce | 63 | 3e | f1 | c1 | 34 | ac | 10 |
| 11 | 3c | 22 | c9 | c0 | dc | bd | 1f | b7 | 03 | 1f | fe | c0 | 92 | 50 | 10 |
| 00 | fe | b9 | 09 | 00 | 00 | | | | | | | | | | |
| 00 | 0c | 29 | 9d | b4 | 1d | 00 | 10 | f3 | 2a | 2a | ac | 08 | 00 | 45 | 00 |
| 00 | 28 | 79 | 0d | 40 | 00 | 76 | 06 | ce | 50 | 3e | f1 | c1 | 34 | ac | 10 |
| 11 | 3c | 22 | c9 | c0 | dc | bd | 1f | b7 | 03 | 1f | fe | c9 | cc | 50 | 10 |
| 01 | 02 | af | cc | 00 | 00 | | | | | | | | | | |

The quantization is applied before the method, namely in reoccurrance detection, as described in the foregoing.

The first frame values after quantization are as follows:

| 00 | 06 | 14 | 4e | 5a | 0e | 00 | 08 | 79 | 15 | 15 | 56 | 04 | 00 | 22 | 00 |
| 00 | 14 | 3c | 7d | 20 | 00 | 3b | 03 | 67 | 31 | 1f | 78 | 60 | 1a | 56 | 08 |
| 08 | 1e | 11 | 64 | 60 | 6e | 5e | 0f | 5b | 01 | 0f | 7f | 60 | 49 | 28 | 08 |
| 00 | 7f | 5c | 04 | 00 | 00 | | | | | | | | | | |

These values are delivered for the first frame, and they are set as a previous buffer for prediction purposes of the next frame.

The input data values for the second frame after quantization are as follows:

| 00 | 06 | 14 | 4e | 5a | 0e | 00 | 08 | 79 | 15 | 15 | 56 | 04 | 00 | 22 | 00 |
| 00 | 14 | 3c | 06 | 20 | 00 | 3b | 03 | 67 | 28 | 1f | 78 | 60 | 1a | 56 | 08 |
| 08 | 1e | 11 | 64 | 60 | 6e | 5e | 0f | 5b | 01 | 0f | 7f | 64 | 66 | 28 | 08 |
| 00 | 01 | 57 | 66 | 00 | 00 | | | | | | | | | | |

Now, the changed/unchanged bit stream can be generated and it is as follows:

0 0 0 0 0 0 0 0 0 0 0 0 0 0 0 0   0 0 0 1 0 0 0 0 0 1 0 0 0 0 0 0
0 0 0 0 0 0 0 0 0 0 0 1 1 0 0   0 1 1 1 0 0

It contains 54 bits (7 ones and 47 zeros), and it can be efficiently compressed later by an entropy encoder. For example, RLE generates a stream of data 19, 1, 5, 1, 18, 2, 3, 3, 2, which can be delivered, for example, with nine five bits values (=9*5 bits=45 bits). Range coding with probabilities 0.13 and 0.87 is also useable for delivering the bits.

The seven changed values for the second frame are then as follows:
06 28 64 66 01 57 66

These seven changed values are optionally compressed with the first frame values (54), for example by using Range coding. Without entropy encoding, they require 61*7 bits=428 bits. When the frames are decoded, then, after the dequantization, the values for the two frames are as follows:

| 00 | 0c | 28 | 9c | b4 | 1c | 00 | 10 | f2 | 2a | 2a | ac | 08 | 00 | 44 | 00 |
| 00 | 28 | 78 | fa | 40 | 00 | 76 | 06 | ce | 62 | 3e | f0 | c0 | 34 | ac | 10 |

-continued

| 10 | 3c | 22 | c8 | c0 | dc | bc | 1e | b6 | 02 | 1e | fe | c0 | 92 | 50 | 10 |
| 00 | fe | b8 | 08 | 00 | 00 | | | | | | | | | | |
| 00 | 0c | 28 | 9c | b4 | 1c | 00 | 10 | f2 | 2a | 2a | ac | 08 | 00 | 44 | 00 |
| 00 | 28 | 78 | 0c | 40 | 00 | 76 | 06 | ce | 50 | 3e | f0 | c0 | 34 | ac | 10 |
| 10 | 3c | 22 | c8 | c0 | dc | bc | 1e | b6 | 02 | 1e | fe | c8 | cc | 50 | 10 |
| 01 | 02 | ae | cc | 00 | 00 | | | | | | | | | | |

Figure 3:
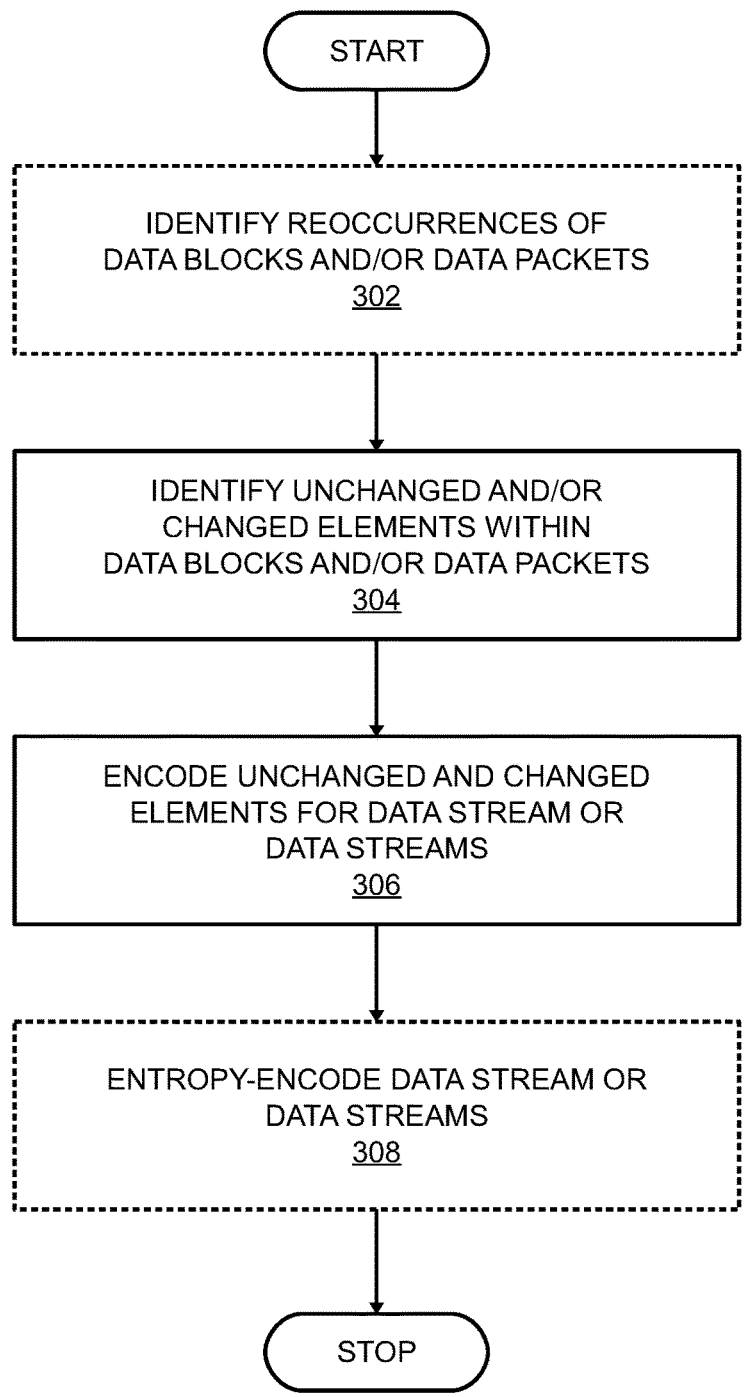
FIG. 3 is an illustration of steps of a method of encoding input data (D1) to generate corresponding encoded data (E2), in accordance with an embodiment of the present disclosure.

FIG. 3 is an illustration of steps of a method of encoding input data (D1) to generate corresponding encoded data (E2), in accordance with an embodiment of the present disclosure. The method is depicted as a collection of steps in a logical flow diagram, which represents a sequence of steps that can be implemented in hardware, software, or a combination thereof.

Optionally, at a step 302, substantial reoccurrences, namely repetitions, of data blocks and/or data packets within the input data (D1) are identified. Optionally, this step 302 is implemented with a deduplication method or with a block encoder. Usually, the step 302 also includes an operation of splitting the input data (D1) into new data blocks or data packets. Alternatively, the data split has already been carried out before the step 302. Beneficially, only partially changed data blocks and/or data packets are delivered further to a step 304 for encoding, wherein the changed data blocks and/or data packets or unchanged data blocks and/or data packets are encoded with different methods, as aforementioned. Optionally, the changed data blocks and/or data packets and/or unchanged data blocks and/or data packets are also delivered to the step 304 for encoding them.

It will be appreciated that, if a certain given reference data block and/or data packet is used, then it does not cause extra data to be transmitted. However, in some situations, the information on the selection of the reference data block and/or data packet needs to be transmitted so that the decoder 112 will be aware of the reference data block and/or data packet and use the same one. Correspondingly, when partially changed data blocks and/or data packets are encoded, then if a portion of the data blocks and/or data packets are not given to the method, then the network environment 100 needs to have some sort of method selection information available, which also needs to be delivered to the decoder 112. Optionally, as mentioned above, it is a block encoder or a deduplication algorithm that takes care of delivering this piece of information, otherwise all data blocks and/or data packets are processed with the method pursuant to the disclosure.

At the step 304, it is identified where elements are unchanged within the substantially reoccurring data blocks and/or data packets, and/or where elements are changed within the substantially reoccurring data blocks and/or data packets.

Next, at a step 306, changed and unchanged elements are encoded in the encoded data (E2) as one data stream. Optionally, two data streams are processed, wherein one data stream contains unchanged/changed decision bits and the other data stream contains changed data values that are to be used.

In accordance with the step 306, the unchanged elements are encoded in the encoded data (E2) by employing at least one corresponding symbol, or at least one corresponding bit, for example a single bit, indicating an absence of change in the unchanged elements relative to corresponding elements in a reference data block and/or data packet. Optionally, the at least one corresponding symbol is represented by a predetermined data value, which is optionally implemented as a zero data value.

Optionally, for a lossless operation, the changed elements are encoded in their original form in the encoded data (E2). Alternatively, optionally, for a lossy operation, at least a portion of the changed elements is encoded in a quantized manner in the encoded data (E2). Yet alternatively, optionally, for a near-lossless operation, at least a portion of the changed elements is encoded in a quantized manner in the encoded data (E2).

The steps 304 and 306 are beneficially performed for partially changed data blocks and/or data packets. Optionally, the steps 304 and 306 are performed for each data block and/or data packet of the input data (D1). An encoding processing of the steps 304 and 306 has been described in conjunction with FIGS. 4A and 4B.

Optionally, the method includes an additional step 308 at which a compression algorithm is applied to compress the encoded data (E2) to generate compressed data (C4). The compressed data (C4) is relatively small in size in comparison to the input data (D1); and therefore, requires a small space for data storage and a small network bandwidth for data transfer over a communication network or over a direct connection. In the step 308, it is beneficial that typically entropy encoding methods such as Range coding, SRLE, EM, ODelta coding and so forth are used there. The step 308 is typically executed with a deduplication method or with a block encoder.

It will be appreciated that compression is optional, but if it is carried out, then either a certain compression method is always used, or alternatively, information conveying the selected compression method needs to be delivered from the encoder 102 to the decoder 112. Typically, the selection of compression method has been left as the responsibility of the block encoder or the deduplication method, but if necessary, the method pursuant to the present disclosure can express and deliver the information conveying information regarding the selected compression method, otherwise a certain compression method is always used, for example a default compression method.

Furthermore, the used reference data block and/or data packet needs to be updated, or a new reference data block and/or reference data packet needs to be generated. Such a step is also typically implemented with a deduplication method or with a block encoder, but optionally the update of a reference data block and/or data packet is carried out with the steps 304 and 306 for reducing the amount of data copying.

Moreover, an amount of background memory allocated for the encoding processing needs to be only as large as an amount of elements in a current data block and/or data packet, times the amount of different reference data blocks and/or data packets. If only one reference data block and/or data packet is used, then the amount of background memory needed is the same as the size of the data block and/or packet. Moreover, a result of the encoding processing, namely, the encoded data (E2), is optionally written or transmitted directly into an original memory. This means that no separate transfer memories are required. Therefore, the method is capable of functioning as an in-place (in situ) operation, and is cost-effective.

The steps 302 to 308 are only illustrative and other alternatives can also be provided where one or more steps are added, one or more steps are removed, or one or more steps are provided in a different sequence without departing from the scope of the claims herein.

Figure 4A:
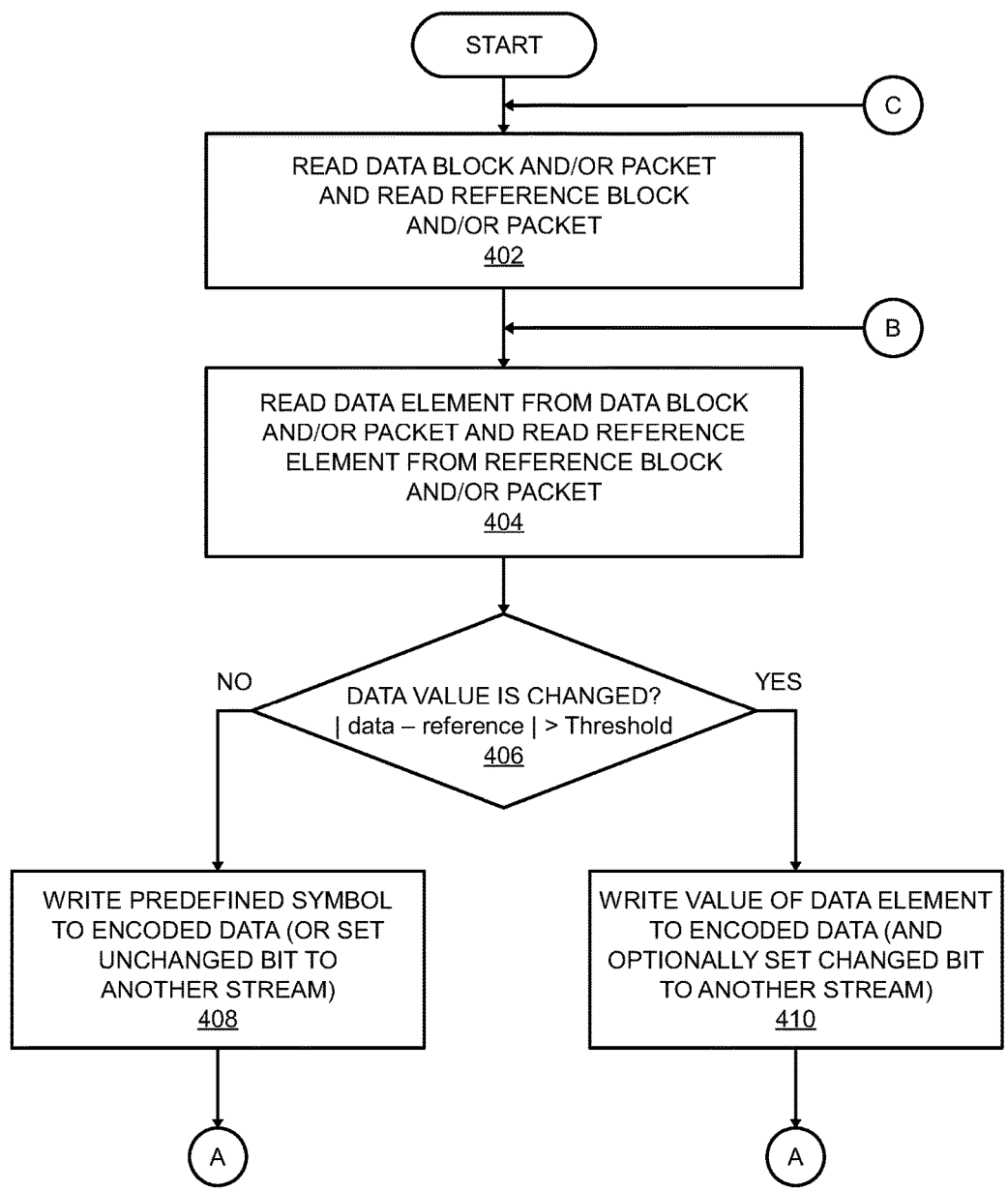
FIGS. 4A and 4B collectively are an illustration of steps of an encoding processing, in accordance with an embodiment of the present disclosure.
Figure 4B:
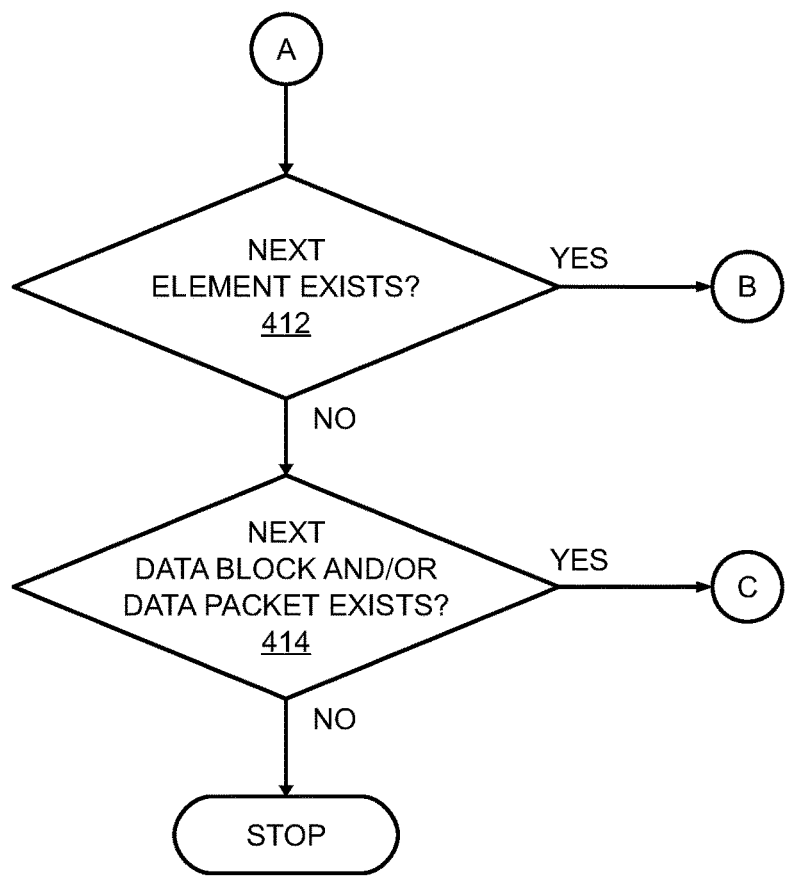

FIGS. 4A and 4B collectively are an illustration of steps of the encoding processing, in accordance with an embodiment of the present disclosure. At a step 402, the data block and/or data packet is read, and the reference data block and/or data packet is also read.

At a step 404, a data value of an element of a given data block and/or data packet of the input data (D1) is read, and a data value of an element of a given reference data block and/or packet is also read.

Next, at a step 406, it is determined whether or not the data value of the element has changed against a data value of a corresponding element in a reference data block and/or data packet. Beneficially, such determination detects that the value has changed when the absolute difference between the values is higher than the threshold value. Optionally, other methods can be used for determining changes of data values.

If, at the step 406, it is determined that the data value of the element has not changed, a step 408 is performed. At the step 408, a predetermined data value is written to the encoded data (E2) to indicate an absence of change, otherwise a decision bit indicating that the data value of the element has not changed is written to a separate stream.

However, if it is determined that the data value of the element has changed, a step 410 is performed. At the step 410, the data value of the element is written to the encoded data (E2) without or with optional quantization, and additionally, optionally a decision bit indicating that the data value of the element has changed is written to a separate stream. Optional quantization is also performed during the reoccurrence detection.

Optionally, at the steps 406 and 408, the data value of the element is also written to the new reference data block and/or data packet. Alternatively, optionally, the changed data value in the step 408 is updated also to the current reference data block and/or packet by using the original changed value with lossless processing and preferably decoded changed value with lossy processing. Alternatively, the reference values are generated or updated with a deduplication method or with a block encoder. The updated reference block and/or packet values are optionally used for next data blocks and/or data packets.

Next, at a step 412, it is determined whether or not a next element exists in the given data block and/or data packet. If it is determined that a next element exists, the encoding processing restarts at the step 404. Otherwise, if it is determined that no next element exists in the given data block and/or data packet, a step 414 is performed.

At the step 414, it is determined whether or not a next data block and/or data packet exists in the input data (D1). If it is determined that a next data block and/or data packet exists, the encoding processing restarts at the step 402. Otherwise, if it is determined that no next data block and/or data packet exists in the input data (D1), the encoding processing stops.

The steps 402 to 414 are only illustrative and other alternatives can also be provided where one or more steps are added, one or more steps are removed, or one or more steps are provided in a different sequence without departing from the scope of the claims herein.

Embodiments of the present disclosure provide a computer program product comprising a non-transitory (namely non-transient) computer-readable storage medium having computer-readable instructions stored thereon, the computer-readable instructions being executable by a computerized device comprising processing hardware to execute the method as described in conjunction with FIG. 3, and FIG. 4A to FIG. 4B. The computer-readable instructions are optionally downloadable from a software application store, for example, from an "App store" to a computerized device.

Figure 5:
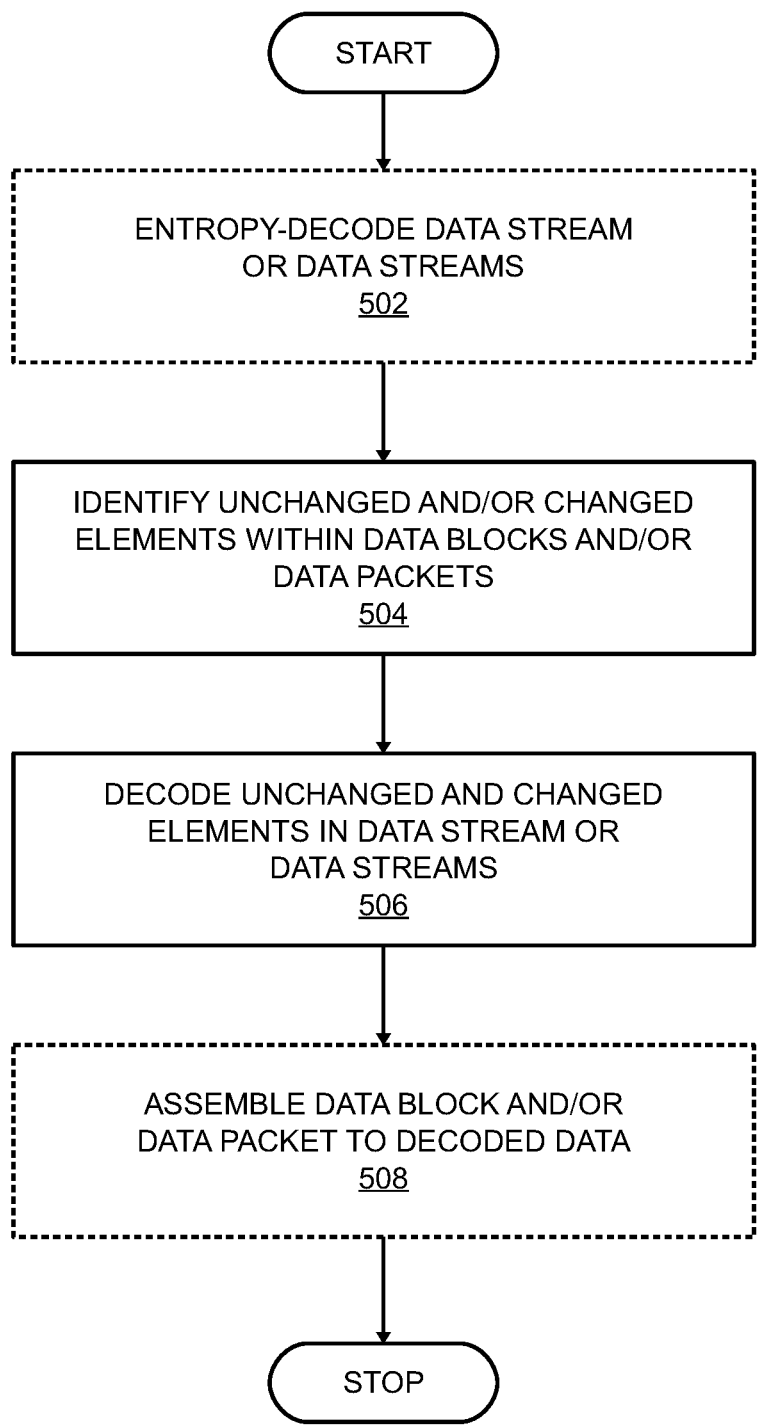
FIG. 5 is an illustration of steps of a method of decoding the encoded data (E2) to generate corresponding decoded data (D3), in accordance with an embodiment of the present disclosure.

FIG. 5 is an illustration of steps of a method of decoding encoded data (E2) to generate corresponding decoded data (D3), in accordance with an embodiment of the present disclosure. The method is depicted as a collection of steps in a logical flow diagram, which represents a sequence of steps that can be implemented in hardware, software, or a combination thereof.

Optionally, at a step 502, decoding of entropy-encoded data streams from the compressed data (C4) to generate the encoded data (E2) is applied. This step 502 optionally typically employs entropy decoding methods such as Range coding, SRLE, EM, ODelta coding and so forth. This step 502 is typically executed by employing a deduplication method or by employing a block decoder.

At a step 504, the encoded data (E2) is searched to identify changed and unchanged elements within substantial reoccurrences of data blocks and/or data packets within the encoded data (E2).

At a step 506, the encoded data (E2) is decoded to generate data for changed and unchanged elements within the substantial reoccurrences of data blocks and/or data packets within the encoded data (E2). In accordance with the step 504, occurrences of at least one corresponding symbol or one corresponding bit indicative of an absence of change are identified, and replaced with the corresponding symbol, or set to the data value for position of the corresponding bit with corresponding elements in a reference data block and/or data packet. For changed blocks, the absence of change is not detected, the encoded value is used. Optionally, for a lossless operation, the changed elements are decoded to their original form in the decoded data (D3). Alternatively, optionally, for a lossy operation, at least a portion of the changed elements is decoded in a quantized manner, namely dequantization is carried out, in the decoded data (D3). Yet alternatively, optionally, for a near-lossless operation, a part of the changed elements is decoded in a quantized manner in the decoded data (D3).

The steps 504 and 506 are performed for partially changed data blocks and/or data packets. Optionally, the steps 504 and 506 are performed for each data block and/or data packet of the encoded data (E2). A decoding processing of the steps 504 and 506 has been described in conjunction with FIGS. 6A and 6B.

Optionally, at a step 508, the data generated for the changed and unchanged elements is assembled from the data blocks and/or data packets to generate the decoded data (D3). This step 508 typically employs a deduplication method or a block decoder.

Moreover, the used reference data block and/or packet needs to be updated or a new reference data block and/or packet needs to be generated. Such a step is also typically performed with a deduplication method or with a block decoder, but optionally, the updating of reference data block and/or data packet is optionally carried out within the steps 504 and 506 for reducing the amount of data copying occurring during decoding operations.

The steps 502 to 508 are only illustrative and other alternatives can also be provided where one or more steps are added, one or more steps are removed, or one or more steps are provided in a different sequence without departing from the scope of the claims herein.

Figure 6A:
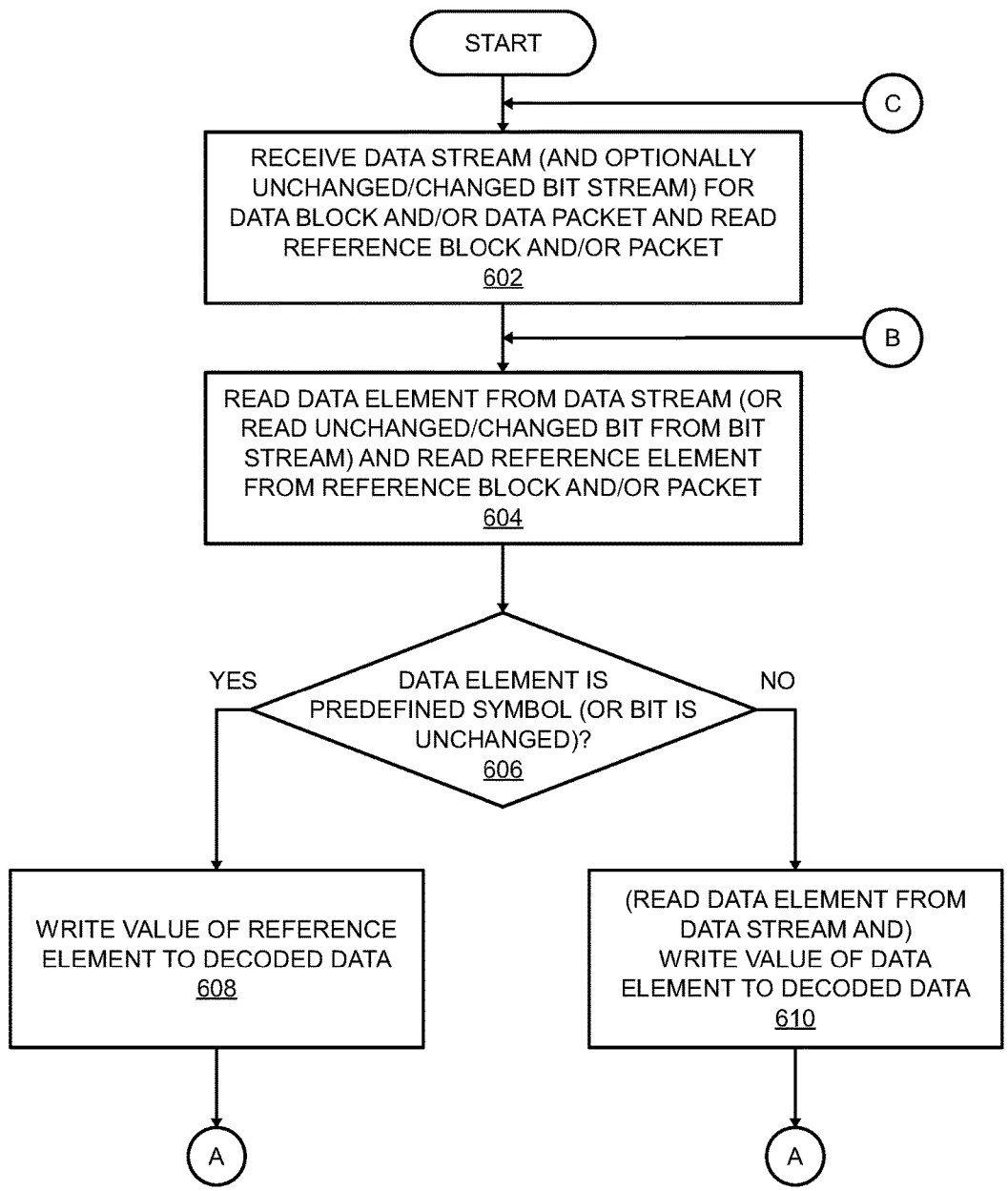
FIGS. 6A and 6B collectively are an illustration of steps of a decoding processing, in accordance with an embodiment of the present disclosure.
Figure 6B:
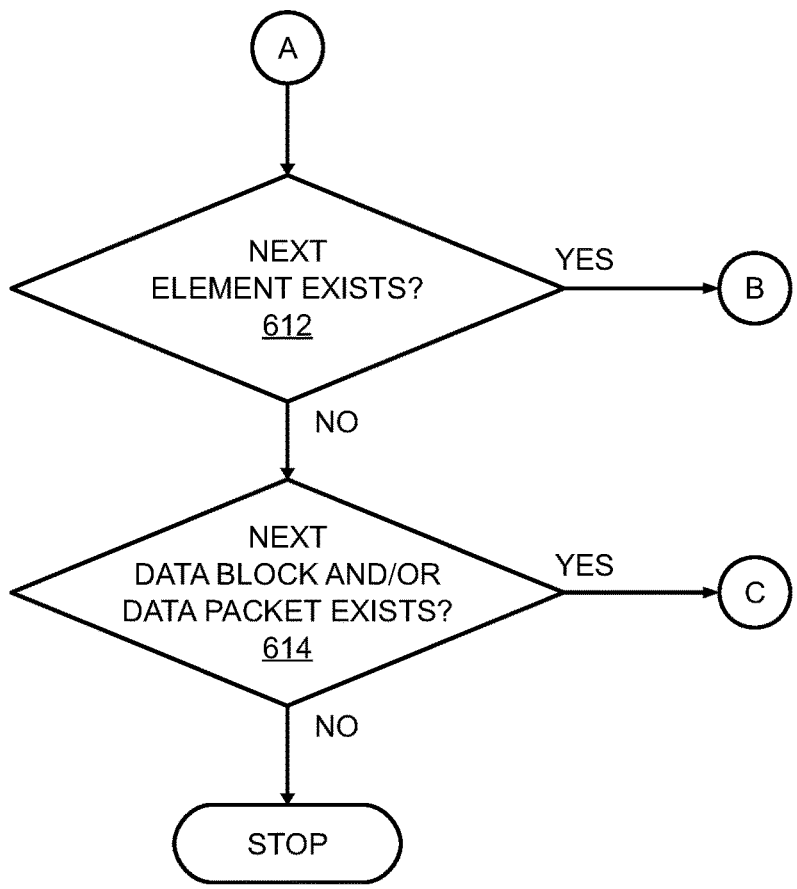

FIGS. 6A and 6B collectively are an illustration of steps of the decoding processing, in accordance with an embodiment of the present disclosure.

At a step 602, a stream of data values of a given data block and/or data packet of the encoded data (E2) is received. Optionally, the stream of bits describing unchanged/changed elements in the data block and/or data packet is also received. Also, the reference data block and/or data packet is read during the step 602.

Next, at a step 604, an element of a given data block and/or packet is read. Alternatively, the unchanged/changed decision bit is read. An element of the reference data block or packet is also read during the step 604.

Next, at a step 606, it is determined whether or not a given element is unchanged. An unchanged element is detected if a predetermined data value has occurred. Alternatively, an unchanged element is detected, if the decision bit is unchanged.

If, at the step 606, the unchanged element is detected, a step 608 is performed. At the step 608, a data value of a corresponding element in a reference data block and/or data packet is written to the decoded data (D3).

Otherwise, if it is determined that the element has changed, a step 610 is performed. At the step 610, the data value of the element is written to the decoded data (D3) without or with optional dequantization. If the detection of changed value was made based on the changed bit in decision bits, then the encoded value first needs to be read at this step, before it can be written to the decoded data (D3). Optional quantization can also be performed during the data assembly.

Optionally, at the steps 608 and 610, the data value of the element is also written to the new reference data block and/or data packet. Alternatively, optionally, the changed data value in the step 610 is also updated to the current reference data block and/or data packet by using the decoded changed value with lossless and lossy processing. Alternatively, the reference values are generated or updated with a deduplication method or with a block decoder, for example as described in the foregoing. The updated reference data block and/or data packet values is optionally used for next data blocks and/or data packets.

Next, at a step 612, it is determined whether or not a next element exists in the given data block and/or data packet. If it is determined that a next element exists, the decoding processing restarts at the step 604. Otherwise, if it is determined that no next element exists in the given data block and/or data packet, a step 614 is performed.

At the step 614, it is determined whether or not a next data block and/or data packet exists in the encoded data (E2). If it is determined that a next data block and/or data packet exists, the decoding processing restarts at the step 602. Otherwise, if it is determined that no next data block and/or data packet exists in the encoded data (E2), the decoding processing stops.

The steps 602 to 614 are only illustrative and other alternatives can also be provided where one or more steps are added, one or more steps are removed, or one or more steps are provided in a different sequence without departing from the scope of the claims herein.

Embodiments of the present disclosure provide a computer program product comprising a non-transitory (namely non-transient) computer-readable storage medium having computer-readable instructions stored thereon, the computer-readable instructions being executable by a computerized device comprising processing hardware to execute the method as described in conjunction with FIGS. 5, and FIGS. 6A to 6B. The computer-readable instructions are optionally downloadable from a software application store, for example, from an "App store" to a computerized device, such as the computerized device 114.

Furthermore, embodiments of the present disclosure provide a codec including at least one encoder as described in conjunction with FIG. 3, and FIGS. 4A to 4B, and at least one decoder as described in conjunction with FIG. 5 and FIGS. 6A to 6B.

Embodiments of the present disclosure are susceptible to being used for various purposes, including, though not limited to, enabling lossless or near-lossless data compression of one-dimensional image data or multi-dimensional image data, video data, audio data and any other type of data with a high compression ratio, in comparison to conventional codecs.

Modifications to embodiments of the present disclosure described in the foregoing are possible without departing from the scope of the present disclosure as defined by the accompanying claims. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

We claim:

1. An encoder including processing hardware for encoding input data to generate corresponding encoded data, wherein the processing hardware is operable to process the input data as data blocks and/or data packets, characterized in that the processing hardware is operable to:
   (i) identify substantial reoccurrences of data blocks and/or data packets within at least a portion of the input data, wherein the data blocks and/or data packets include a corresponding plurality of elements, wherein the elements include a plurality of bits;
   (ii) identify where elements are unchanged within the substantially reoccurring data blocks and/or data packets, and/or where elements are changed within the substantially reoccurring data blocks and/or data packets;
   (iii) encode unchanged elements in the encoded data by employing at least one corresponding symbol or at least one corresponding bit indicating an absence of change in the unchanged elements relative to corresponding elements in a reference data block and/or data packet; and
   (iv) encode changed elements in the encoded data.

2. An encoder as claimed in claim 1, characterized in that the input data is in a form of at least one of: text data, image data, video data, audio data, binary data, sensor data, measurement data, graphical data, multi-dimensional data, uni-dimensional data.

3. An encoder as claimed in claim 1, characterized in that the at least one corresponding symbol is represented by a predetermined data value.

4. An encoder as claimed in claim 3, characterized in that the predetermined data value is implemented as a zero data value.

5. An encoder as claimed in claim 1, characterized in that the processing hardware is operable to implement chunked transfer encoding for Hypertext Transfer Protocol (HTTP) and/or Real-Time Messaging Protocol (RTMP).

6. An encoder as claimed in claim 5, characterized in that the HTTP and/or RTMP employ fixed-size data blocks and/or data packets inside requests and responses.

7. An encoder as claimed in claim 1, characterized in that the processing hardware is operable to encode at least a portion of the changed elements in a quantized manner in the encoded data.

8. An encoder as claimed in claim 1, characterized in that the processing hardware is operable to apply a compression algorithm to compress the encoded data.

9. A method of encoding input data to generate corresponding encoded data, wherein the method includes processing the input data as data blocks and/or data packets, characterized in that the method includes:
   identifying, by a processor, substantial reoccurrences of data blocks and/or data packets within at least a portion of the input data, wherein the data blocks and/or data packets include a corresponding plurality of elements, wherein the elements include a plurality of bits;
   (ii) identifying, by the processor, in respect of individual elements where elements are unchanged within the substantially reoccurring data blocks and/or data packets, and/or where elements are changed within the substantially reoccurring data blocks and/or data packets;
   (iii) encoding, by the processor, unchanged elements in the encoded data by employing at least one corresponding symbol or at least one corresponding bit indicating an absence of change in the unchanged elements relative to corresponding elements in a reference data block and/or data packet; and
   (iv) encoding, by the processor, changed elements in the encoded data.

10. A method as claimed in claim 9, characterized in that the method includes encoding, by the processor, the input data received in a form of at least one of: text data, image data, video data, audio data, binary data, sensor data, measurement data, graphical data, multi-dimensional data, uni-dimensional data.

11. A method as claimed in claim 9, characterized in that the method includes representing, by the processor, the at least one corresponding symbol by a predetermined data value.

12. A method as claimed in claim 11, characterized in that the predetermined data value is implemented as a zero data value.

13. A method as claimed in claim 9, characterized in that the method includes implementing, by the processor, chunked transfer encoding for Hypertext Transfer Protocol (HTTP) and/or Real-Time Messaging Protocol (RTMP).

14. A method as claimed in claim 13, characterized in that the HTTP and/or RTMP employ fixed-size data blocks and/or data packets inside requests and responses.

15. A method as claimed in claim 9, characterized in that the method includes encoding, by the processor, at least a portion of the changed elements in a quantized manner in the encoded data.

16. A method as claimed in claim 9, characterized in that the method includes applying, by the processor, a compression algorithm to compress the encoded data to generate corresponding compressed data.

17. A computer program product comprising a non-transitory computer-readable storage medium having computer-readable instructions stored thereon, the computer-readable instructions being executable by a computerized device comprising the processor to execute a method as claimed in claim 9.

18. A decoder including processing hardware for decoding encoded data to generate corresponding decoded data, wherein the processing hardware is operable to process the encoded data as data blocks and/or data packets, characterized in that the processing hardware is operable to:
  (i) decode the encoded data to generate data for changed elements, the changed elements being elements that are changed within substantial reoccurrences of data blocks and/or data packets within the encoded data;
  (ii) decode the encoded data to generate data for unchanged elements, the unchanged elements being elements that are unchanged within the substantial reoccurrences of data blocks and/or data packets within the encoded data, wherein the unchanged elements are represented by at least one corresponding symbol or at least one corresponding bit indicating an absence of change in the unchanged elements relative to corresponding elements in a reference data block and/or data packet; and
  (iii) assemble the data generated for the changed and unchanged elements in (i) and (ii) into data blocks and/or data packets to generate the decoded data, wherein the data blocks and/or data packets include a corresponding plurality of elements, wherein the elements include a plurality of bits.

19. A decoder as claimed in claim 18, characterized in that the decoded data is in a form of at least one of: text data, image data, video data, audio data, binary data, sensor data, measurement data, graphical data, multi-dimensional data, uni-dimensional data.

20. A decoder as claimed in claim 18, characterized in that the at least one corresponding symbol is represented by a predetermined data value.

21. A decoder as claimed in claim 20, characterized in that the predetermined data value is implemented as a zero data value.

22. A decoder as claimed in claim 18, characterized in that the processing hardware is operable to implement chunked transfer encoding for Hypertext Transfer Protocol (HTTP) and/or Real-Time Messaging Protocol (RTMP).

23. A decoder as claimed in claim 22, characterized in that the HTTP and/or RTMP employ fixed-size data blocks and/or data packets inside requests and responses.

24. A decoder as claimed in claim 18, characterized in that the processing hardware is operable to decode at least a portion of the changed elements in a quantized manner in the decoded data.

25. A decoder as claimed in claim 18, characterized in that the processing hardware is operable to apply a decompression algorithm to decompress compressed data to generate the encoded data for decoding the encoded data to generate the data for the changed and unchanged elements.

26. A method of decoding encoded data to generate corresponding decoded data, wherein the method includes processing the encoded data as data blocks and/or data packets, characterized in that the method includes:
  (i) decoding, by a processor, the encoded data to generate data for changed elements, the changed elements being elements that are changed within substantial reoccurrences of data blocks and/or data packets within the encoded data;
  (ii) decoding, by the processor, the encoded data to generate data for unchanged elements, the unchanged elements being elements that are unchanged within the substantial reoccurrences of data blocks and/or data packets within the encoded data, wherein the unchanged elements are represented by at least one corresponding symbol or at least one corresponding bit indicating an absence of change in the unchanged elements relative to corresponding elements in a reference data block and/or data packet; and
  (iii) assembling, by the processor, the data generated for the changed and unchanged elements in steps (i) and (ii) into data blocks and/or data packets to generate the decoded data, wherein the data blocks and/or data packets include a corresponding plurality of elements, wherein the elements include a plurality of bits.

27. A method as claimed in claim 26, characterized in that the method includes generating, by the processor, the decoded data in a form of at least one of: text data, image data, video data, audio data, binary data, sensor data, measurement data, graphical data, multi-dimensional data, uni-dimensional data.

28. A method as claimed in claim 26, characterized in that the at least one corresponding symbol is represented by a predetermined data value.

29. A method as claimed in claim 28, characterized in that the predetermined data value is implemented as a zero data value.

30. A method as claimed in claim 26, characterized in that the method includes implementing, by the processor, chunked transfer encoding for Hypertext Transfer Protocol (HTTP) and/or Real-Time Messaging Protocol (RTMP).

31. A method as claimed in claim 30, characterized in that the HTTP and/or RTMP employ fixed-size data blocks and/or data packets inside requests and responses.

32. A method as claimed in claim 26, characterized in that the method includes decoding, by the processor, at least a portion of the changed elements in a quantized manner in the decoded data.

33. A method as claimed in claim 26, characterized in that the method includes applying, by the processor, a decompression algorithm to decompress compressed data to generate the encoded data for decoding the encoded data to generate the data for the changed and unchanged elements.

34. A computer program product comprising a non-transitory computer-readable storage medium having computer-readable instructions stored thereon, the computer-readable instructions being executable by a computerized device comprising processing hardware to execute a method of decoding encoded data to generate corresponding decoded data, wherein the method includes processing the encoded data as data blocks and/or data packets, characterized in that the method includes:
  (i) decoding the encoded data to generate data for changed elements, the changed elements being elements that are changed within substantial reoccurrences of data blocks and/or data packets within the encoded data;
  (ii) decoding the encoded data to generate data for unchanged elements, the unchanged elements being elements that are unchanged within the substantial reoccurrences of data blocks and/or data packets within the encoded data, wherein the unchanged elements are represented by at least one corresponding symbol or at least one corresponding bit indicating an absence of change in the unchanged elements relative to corresponding elements in a reference data block and/or data packet; and
  (iii) assembling the data generated for the changed and unchanged elements in steps (i) and (ii) into data blocks and/or data packets to generate the decoded data, wherein the data blocks and/or data packets include a corresponding plurality of elements, wherein the elements include a plurality of bits.

35. A codec including at least one encoder including processing hardware for encoding input data to generate corresponding encoded data, wherein the processing hardware is operable to process the input data as data blocks and/or data packets, characterized in that the processing hardware is operable to:
  (i) identify substantial reoccurrences of data blocks and/or data packets within at least a portion of the input data, wherein the data blocks and/or data packets include a corresponding plurality of elements, wherein the elements include a plurality of bits;
  (ii) identify where elements are unchanged within the substantially reoccurring data blocks and/or data packets, and/or where elements are changed within the substantially reoccurring data blocks and/or data packets;
  (iii) encode unchanged elements in the encoded data by employing at least one corresponding symbol or at least one corresponding bit indicating an absence of change in the unchanged elements relative to corresponding elements in a reference data block and/or data packet; and
  (iv) encode changed elements in the encoded data; and at least one decoder including processing hardware for decoding encoded data to generate corresponding decoded data, wherein the processing hardware is operable to process the encoded data as data blocks and/or data packets, characterized in that the processing hardware is operable to:
  (i) decode the encoded data to generate data for changed elements, the changed elements being elements that are changed within substantial reoccurrences of data blocks and/or data packets within the encoded data;
  (ii) decode the encoded data to generate data for unchanged elements, the unchanged elements being elements that are unchanged within the substantial reoccurrences of data blocks and/or data packets within the encoded data, wherein the unchanged elements are represented by at least one corresponding symbol or at least one corresponding bit indicating an absence of change in the unchanged elements relative to corresponding elements in a reference data block and/or data packet; and
  (iii) assemble the data generated for the changed and unchanged elements in (i) and (ii) into data blocks and/or data packets to generate the decoded data, wherein the data blocks and/or data packets include a corresponding plurality of elements, wherein the elements include a plurality of bits.

* * * * *